(12) United States Patent
Kim

(10) Patent No.: US 11,789,080 B2
(45) Date of Patent: Oct. 17, 2023

(54) MOTOR CONTROL DEVICE AND METHOD

(71) Applicant: HL MANDO CORPORATION, Pyeongtaek-si (KR)

(72) Inventor: GangHyeon Kim, Seoul (KR)

(73) Assignee: HL MANDO CORPORATION, Pyeongtaek-si (KR)

( * ) Notice: Subject to any disclaimer, the term of this patent is extended or adjusted under 35 U.S.C. 154(b) by 0 days.

(21) Appl. No.: 17/726,749

(22) Filed: Apr. 22, 2022

(65) Prior Publication Data

US 2022/0341994 A1 Oct. 27, 2022

(30) Foreign Application Priority Data

Apr. 27, 2021 (KR) .......................... 10-2021-0054075

(51) Int. Cl.
*G01R 31/34* (2020.01)
*H02P 27/08* (2006.01)

(52) U.S. Cl.
CPC .............. *G01R 31/34* (2013.01); *H02P 27/08* (2013.01)

(58) Field of Classification Search
CPC .................................. G01R 31/34; H02P 27/08
See application file for complete search history.

(56) References Cited

U.S. PATENT DOCUMENTS

2021/0139039 A1* 5/2021 Joo ........................ B60W 10/26

FOREIGN PATENT DOCUMENTS

KR 102219065 B1 * 2/2021 .............. H02P 27/08

* cited by examiner

*Primary Examiner* — Minh Q Phan
(74) *Attorney, Agent, or Firm* — Hauptman Ham, LLP

(57) ABSTRACT

The disclosure relates to a motor control device and method. According to the disclosure, a motor control device comprises a controller generating a control signal for controlling an operation of an electric motor, an inverter controller generating a switching control signal for controlling an operation of one or more switching elements connected to the electric motor, based on the control signal, and a receiver receiving voltage information about a voltage of the electric motor. The controller determines whether the electric motor has a failure based on the voltage information received in a dead time period generated according to the control signal.

8 Claims, 9 Drawing Sheets

MOTOR CONTROL DEVICE AND METHOD

CROSS-REFERENCE TO RELATED APPLICATION

This application claims priority from Korean Patent Application No. 10-2021-0054075, filed on Apr. 27, 2021, which is hereby incorporated by reference for all purposes as if fully set forth herein.

BACKGROUND

Field

The disclosure relates to a motor control device and method and, more specifically, to a motor control device and method capable of determining a failure in a motor according to the voltage of the motor.

Description of Related Art

In general, a vehicle adopts a power steering assist device as means to ensure steering stability by reducing the steering force of the steering wheel. Conventionally, hydraulic power steering (HPS) has been widely used as power steering assist devices but are recently being replaced with electric power steering (EPS) which facilitates steering using a motor, instead of a hydraulic pump, and is eco-friendly.

An EPS is configured so that the steering torque generated by the rotation of the steering wheel is transferred via the rack-pinion mechanism to the rack bar, and the steering assist power generated by the motor according to the generated steering torque is transferred to the rack bar. In other words, the steering torque generated by the steering wheel and the steering assist power generated by the motor are added, leading to the axial movement of the rack bar. In such EPS, a short circuit between the motor and power source or between the motor and the ground while the motor is operating may cause an over-current flow, likely damaging the motor or the switching element for driving the motor. Therefore, a need exists for steadily monitoring whether a short circuit occurs.

BRIEF SUMMARY

In the foregoing background, according to the disclosure, there is provided a motor control device and method that may determine a failure in the electric motor by receiving voltage information about the electric motor received in a dead time period.

To achieve the foregoing objectives, in an aspect, the disclosure provides a motor control device comprises a controller generating a control signal for controlling an operation of an electric motor, an inverter controller generating a switching control signal for controlling an operation of one or more switching elements connected to the electric motor, based on the control signal, and a receiver receiving voltage information about a voltage of the electric motor. The controller determines whether the electric motor has a failure based on the voltage information received in a dead time period generated according to the control signal.

In another aspect, the disclosure provides a motor control method according to the disclosure may include a control signal generation step generating a control signal for controlling an operation of an electric motor, a switching element control step generating a switching control signal for controlling an operation of one or more switching elements connected to the electric motor, based on the control signal, a motor voltage reception step receiving voltage information about a voltage of the electric motor, and a motor failure determination step determining a failure in the electric motor based on the voltage information received in a dead time period generated according to the control signal.

According to the disclosure, the motor control device and method may detect a short circuit between the motor and the switching element through the voltage of the electric motor, is not affected by a variation in Rdson (the resistance when the switching element is in an on state) according to the temperature, and may save costs due to no additional change to the inverter circuit.

DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
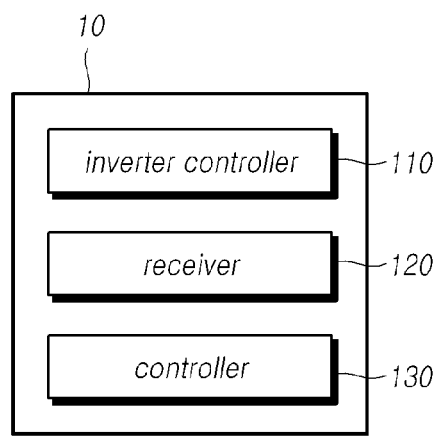
FIG. 1 is a block diagram illustrating a motor control device according to the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

A motor control device 10 is described below with reference to the accompanying drawings, according to an embodiment of the disclosure.

FIG. 1 is a block diagram illustrating a motor control device 10 according to the disclosure.

Referring to FIG. 1, a motor control device 10 according to the disclosure may include an inverter controller 110, a receiver 120, and a controller 130.

The motor control device 10 may generate a control signal for controlling the operation of the electric motor 30 and generate a switching control signal for controlling the operation of one or more switching elements connected to the electric motor 30 based on the control signal. The motor control device 10 may receive voltage information about the electric motor 30, generated in response to the switching control signal and determine a failure in the electric motor 30 based on the voltage information received in a dead time period.

The electric motor 30 may be a motor that includes a stator and a commutator having a coil winding and is rotated according to voltage or power. The electric motor 30 may be a direct-current (DC) motor whose operation direction is changed depending on the polarity of DC power.

The inverter controller 110 may generate a switching control signal for controlling the operation of one or more switching elements connected to the electric motor 30 based on the control signal generated from the controller 130. The switching element may be included in an inverter 20 to vary the voltage or current. The switching element may include a field effect transistor (FET) but, without limited thereto, may include any element (e.g., a transistor or a switch) that may control, e.g., DC motors, steering motors, tilt motors, or telescopic motors.

A switching element according to an embodiment is described below with reference to FIG. 2.

Figure 2:
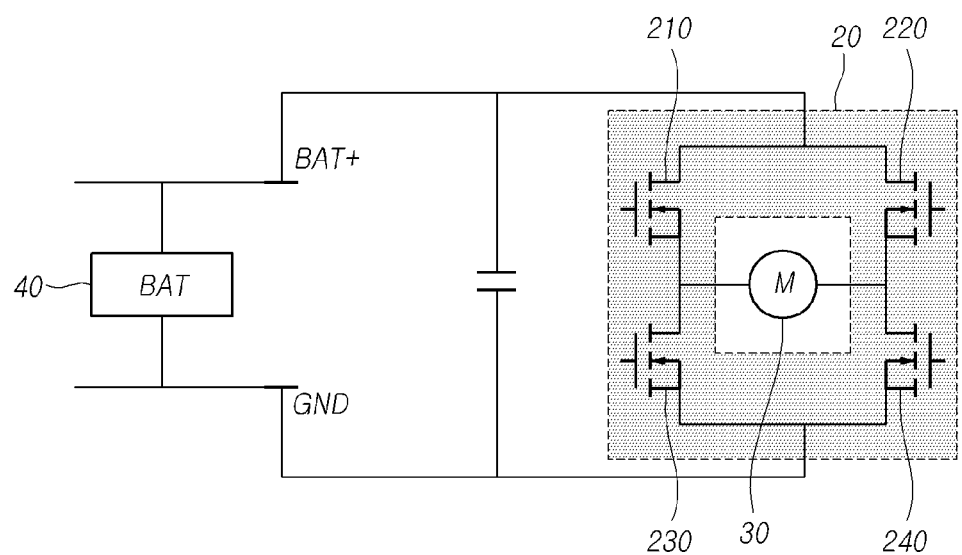
FIG. 2 is a circuit diagram illustrating a switching element according to an embodiment.

FIG. 2 is a circuit diagram illustrating a switching element according to an embodiment.

Referring to FIG. 2, one or more switching elements controlled by switching control signals may include a first switching element 210 and a third switching element 230 connected to a first phase of a 2-phase inverter structure and a second switching element 220 and a fourth switching element connected to a second phase of the 2-phase inverter structure. The plus terminal of the electric motor 30 may be connected to the first phase of the inverter, and the minus terminal of the electric motor 30 may be connected to the second phase of the inverter. In other words, the inverter 20 may include the first to fourth switching elements, and each switching element may be operated by the switching control signal. The inverter 20 may be a PWM voltage-type inverter that switches DC voltage using a transistor, insulated gate bipolar transistor (IGBT) (a junction transistor having a metal-oxide-semiconductor field-effect transistor (MOSFET) in the gate) or gate turn-off thyristor (GTO) while keeping voltage constant using a condenser in a DC circuit or a pulse amplitude modulation (PAM) voltage-type inverter that creates a variable DC voltage in an alternating current (AC)-DC converter to control the inverter output voltage and switches the DC voltage by a transistor or GTO (a kind of semiconductor device that performs a turn-off by flowing a reverse current to the gate) to vary the output frequency. However, such an inverter is merely an example, and is not limited to a specific inverter.

The inverter controller 110 may control the first switching element 210, the second switching element 220, the third switching element 230, and the fourth switching element 240 to turn on or off through switching control signals.

The electric motor 30 may receive power from a battery 40 and, as the first to fourth switching elements turn on or off based on the switching control signal, the electric motor 30 may rotate in the forward or reverse direction.

The operation of switching elements according to an embodiment is described below with reference to FIGS. 3 and 4.

Figure 3:
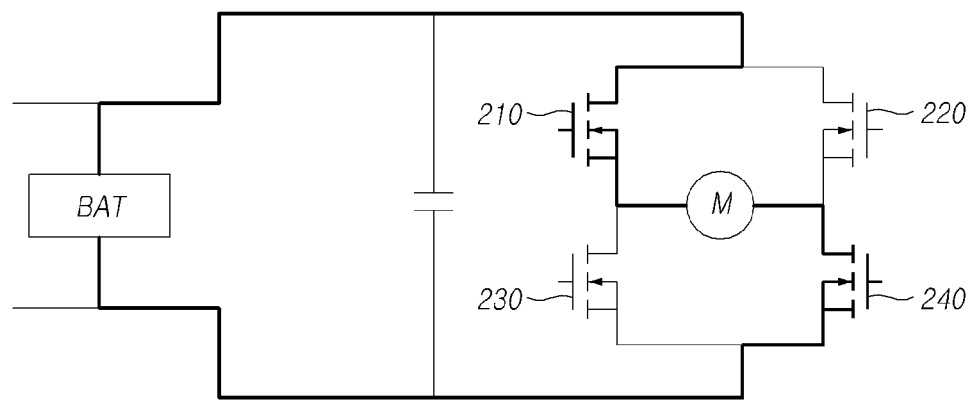
FIGS. 3 and 4 are circuit diagrams illustrating the operation of a switching element.
Figure 4:
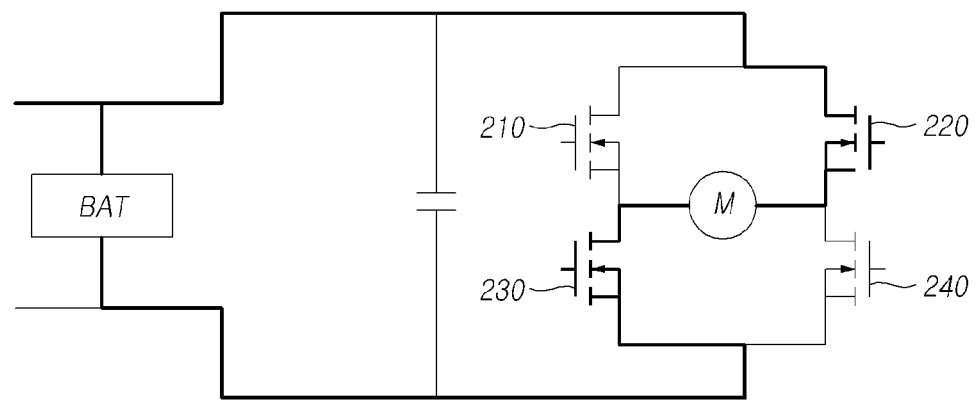

FIGS. 3 and 4 are circuit diagrams illustrating the operation of a switching element.

Referring to FIG. 3, if the first switching element 210 and the fourth switching element 240 are turned on, and the second switching element 220 and the third switching element 230 are turned off by switching control signals, a voltage of the battery level may be applied to the plus terminal of the electric motor 30. The electric motor 30 may be rotated in the forward direction. For convenience of description, the operation of the first to fourth switching elements (the operation in which the first switching element 210 and the fourth switching element 240 are turned on, and the second switching element 220 and the third switching element 230 are turned off) is defined as a first operation.

Referring to FIG. 4, if the first switching element 210 and the fourth switching element 240 are turned off, and the second switching element 220 and the third switching element 230 are turned on by switching control signals, a voltage of the ground level may be applied to the plus terminal of the electric motor 30. The electric motor 30 may be rotated in the reverse direction. For convenience of description, the operation of the first to fourth switching elements (the operation in which the first switching element 210 and the fourth switching element 240 are turned off, and the second switching element 220 and the third switching element 230 are turned on) is defined as a second operation.

The inverter controller 110 may receive a control signal including power conversion period information according to preset pulse width modulation (PWM) from the controller 130 and may control the first to fourth switching elements based on the control signal. Specifically, the controller 130 may compare a triangular wave, which is generated at a predetermined period with a predetermined value and may generate a control signal that turn off the corresponding switching element if the value of the triangular wave is larger than the predetermined value while turning off the corresponding switching element if the value of the triangular wave is smaller than the predetermined value. The inverter controller 110 may generate a switching control signal based on the control signal and control the operation of the first to fourth switching elements through the switching control signal. As the triangular wave is generated at a predetermined period, switching control by the above-described control signal may be performed in two patterns. For example, the switching control signal may be a switching control signal corresponding to the circuit diagrams of FIGS. 3 and 4 described above. The above-described waveform applied to PWM is not limited to the triangular wave but may be any waveform that is periodic and is able to be compared with a predetermined value.

Figure 5:
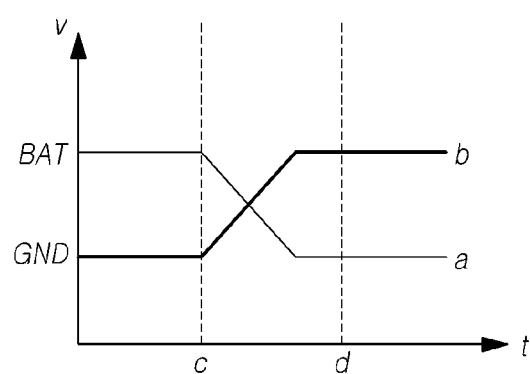
FIG. 5 is a view illustrating a dead time period generated by a control signal according to an embodiment.

FIG. 5 is a view illustrating a dead time period generated by a control signal according to an embodiment.

The control signal including power conversion period information according to PWM as described above allows the switching element to repeatedly turn on and off and, if controlling the first switching element 210 and the third switching element 230 to simultaneously turn on and off, the first switching element 210 and the third switching element 230 may simultaneously be conducted due to a difference in time delay in actual gating signal transmission and a difference between the on and off times of the semiconductor switches, so that a short circuit accident may occur. Thus, the controller 130 may generate a control signal so that after a predetermined time elapses to ensure that a switching element of one of the first and second phases of the inverter 20 is turned off, another switching element of the phase is turned on. Such predetermined time for ensuring the turn-off may be defined as a dead time or blacking time. In other words, during the dead time, the first switching element 210 and third switching element 230 of the first phase of the inverter 20 may simultaneously be turned off.

Referring to FIG. 5, a and b may denote the voltage of the electric motor 30 in the circuits of FIGS. 3 and 4. Depending on the switching control signal, the battery level voltage BAT and the ground level voltage GND may be applied to the plus terminal of the electric motor 30. As the switching elements of each phase are alternately turned on and off, a dead time period occurs. The period between c and d of FIG. 5 may be the above-described dead time period.

a of FIG. 5 is a graph depicting the voltage of the electric motor 30 when the first switching element 210 and the fourth switching element 240 are turned on, the dead time period passes according to the control signal, and then, the first switching element 210 and the fourth switching element 240 are turned off. b of FIG. 5 is a graph depicting the voltage of the electric motor 30 when the second switching element 220 and the third switching element 230 are turned off, the dead time period passes according to the control signal, and then, the second switching element 220 and the third switching element 230 are turned on.

The dead time period generated while switching from the first operation to the second operation may be from c to d in FIG. 5. Specifically, as all of the first to fourth switching elements are turned off, the voltage of the electric motor 30 may drop to the ground level as in a of FIG. 5. As in b of FIG. 5, as the second switching element 220 and the third switching element 230 switch from the off state to the on state, the voltage of the electric motor 30 may rise from the ground level to the battery level. In the dead time period, all of the switching elements are turned off. The reason why the voltage in b of FIG. 5 rises is that as the first operation switches to the second operation, a current path along which the current reversely flows from the GND terminal through the motor to the BAT terminal is created through the parasitic diode included in the second switching element 220 and the third switching element 230 so that the current flows in the direction along which it used to flow by the motor inductance. Similarly, upon switching from the second operation to the first operation, a current path along which the current reversely flows from the GND terminal through the motor to the BAT terminal may be created through the parasitic diode included in the first switching element 210 and the fourth switching element 240. Accordingly, the dead time period may further include a predetermined time in the period where the voltages of the electric motor 30 cross each other. The predetermined time may be preferably about 500 usec.

Thus, the dead time period may include a period from a state in which the first switching element 210 and the fourth switching element 240 are turned on, and the second switching element 220 and the third switching element 230 are turned off to a state in which the first switching element 210 and the fourth switching element 240 are turned off, and the second switching element 220 and the third switching element 230 are turned on. Further, the dead time period may include a period during which the first to fourth switching elements are turned off.

The receiver 120 may receive voltage information about the voltage of the electric motor 30.

Specifically, the receiver 120 may receive information detected by a voltage sensor capable of detecting the voltage of the electric motor 30, from the voltage sensor and transmit the information to the controller 130. The voltage information may be the phase voltage of the electric motor 30.

The controller 130 may generate a control signal for controlling the operation of the electric motor 30. The controller 130 may determine whether the electric motor 30 has a failure based on the voltage information received in the dead time period generated according to the control signal.

The inverter controller 110 may generate a switching control signal for controlling the operation of the switching element based on the control signal generated by the controller 130 To prevent a short circuit between the first to fourth switching elements performing switching according to the switching control signal, the controller 130 may set the control signal to include the dead time period.

If the voltage information received in the dead time period is a threshold or more, the controller 130 may determine that the electric motor 30 has a failure.

Figure 6:
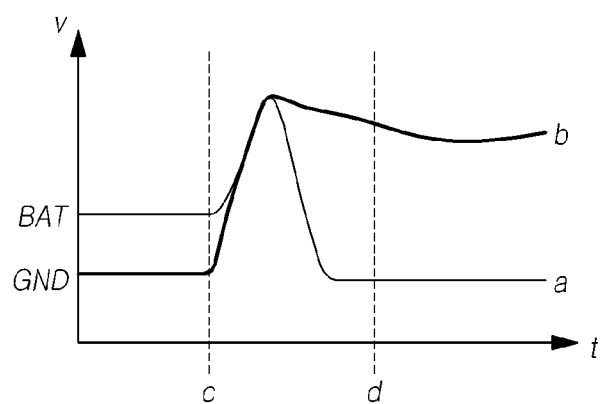
FIG. 6 is a view illustrating an example in which a motor control device determines a failure in a motor according to an embodiment.

FIG. 6 is a view illustrating an example in which a motor control device 10 determines a failure in a motor according to an embodiment.

Referring to FIG. 6, in the dead time period (period from c to d in FIG. 6) generated upon switching from the first operation to the second operation as described above, the first switching element 210 and the fourth switching element 240 are turned off. Thus, although the voltage of the electric motor 30 gradually decreases to the ground level, the voltage rises as in a of FIG. 6 and, as the second switching element 220 and the third switching element 230 are turned on, the voltage of the electric motor 30 rises beyond the battery level. In such a case, the controller 130 may determine that the electric motor 30 has a failure.

This is differentiated from the Vdsth method, which is a technique for determining a failure in a motor, and may determine whether a short circuit occurs between the switching element and the motor by detecting Vds (source-drain voltage, the voltage between the source and drain of each switching element) and comparing Vds with a preset reference detection voltage Vdsth connected to an external power source and determine a failure in the motor.

In contrast, the conventional Vdsth method is capable of detection at a certain temperature but incapable of detection at other temperature since the Rdson (the resistance when the switching element is in the on state) is varied depending on temperature and, due to an increase in Rdson at a high temperature, may erroneously recognize a short circuit although no short circuit occurs. Further, when the resistance of the wire harness is high, the conventional Vdsth method fails to detect a short circuit because the current does not reach the threshold.

As described above, the motor control device 10 determines a failure in the electric motor 30 based on the voltage of the electric motor 30. Thus, the motor control device 10 is not affected by variations in Rdson according to temperatures nor is it influenced by a difference in current value according to the length of the wire harness. Further, the motor control device 10 is freed from the need for setting the threshold of Vds for the switching element to be detected in the gate driver every time, thus saving costs.

Figure 7:
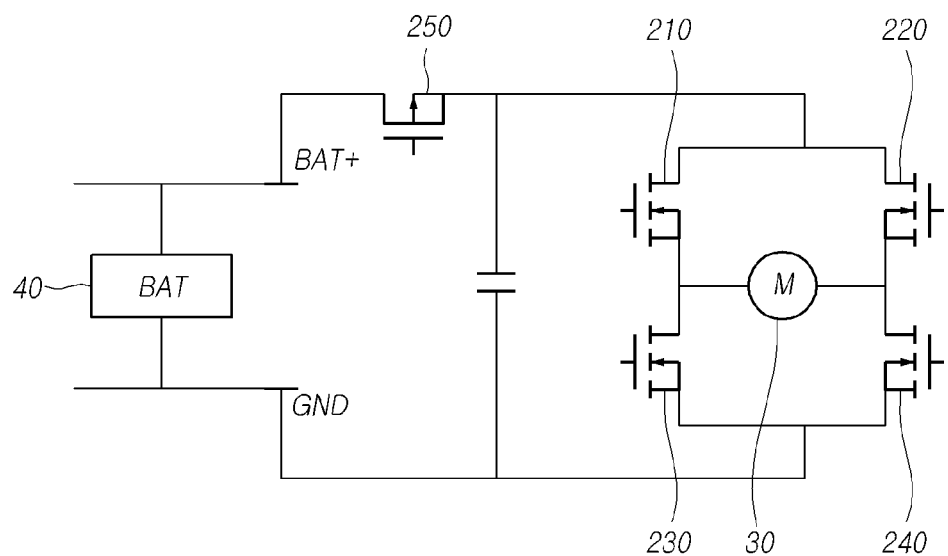
FIG. 7 is a circuit diagram illustrating an example of turning off a fifth switching element when an electric motor has a failure according to an embodiment.

FIG. 7 is a circuit diagram illustrating an example of turning off a fifth switching element when an electric motor 30 has a failure according to an embodiment.

Referring to FIG. 7, upon determining that the electric motor 30 has a failure, the controller 130 may control the fifth switching element connected to the battery 40 for supplying power to turn off. To prevent the first switching element 210 and the second switching element 220 from being shorted to cause an overcurrent, the controller 130 may control the fifth switching element connected with the battery 40 to turn off. To that end, the fifth switching element may be positioned between the inverter 20 and the battery 40.

According to the disclosure, the motor control device 10 may be implemented as an electronic control unit (ECU). The ECU may include at least one or more of one or more processors, a memory, a storage unit, a user interface input unit, or a user interface output unit which may communicate with one another via a bus. The ECU may also include a network interface for accessing a network. The processor may be a central processing unit (CPU) or semiconductor device that executes processing instructions stored in the memory and/or the storage unit. The memory and the storage unit may include various types of volatile/non-volatile storage media. For example, the memory may include a read only memory (ROM) and a random access memory (RAM).

Described below is a motor control method using the motor control device 10 capable of performing the above-described embodiments of the disclosure.

Figure 8:
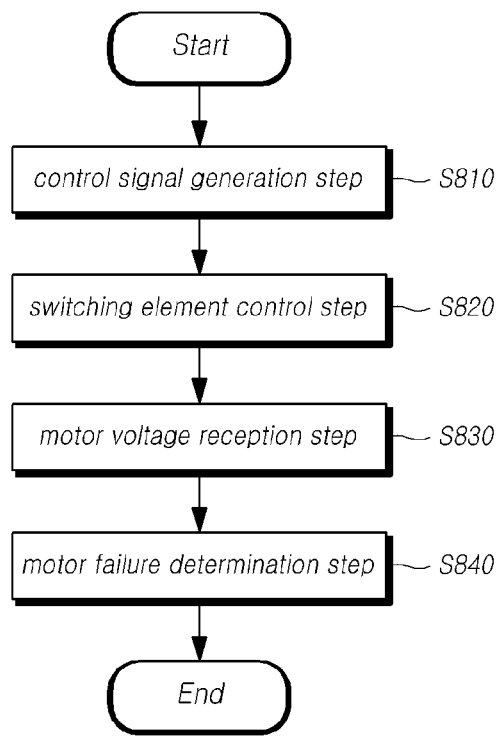
FIG. 8 is a flowchart illustrating a motor control method according to the disclosure.

FIG. 8 is a flowchart illustrating a motor control method according to the disclosure.

Referring to FIG. 8, a motor control method according to the disclosure may include a control signal generation step S810 generating a control signal for controlling an operation of an electric motor 30, a switching element control step S820 generating a switching control signal for controlling an operation of one or more switching elements connected to the electric motor 30, based on the control signal, a motor voltage reception step S830 receiving voltage information about a voltage of the electric motor 30, and a motor failure determination step S840 determining a failure in the electric motor 30 based on the voltage information received in a dead time period generated according to the control signal. The control signal may include power conversion period information according to preset pulse width modulation (PWM).

The motor control method may further include a step for controlling a switching element connected with the battery 40 supplying power to turn off if the electric motor 30 is determined to have a failure.

If the voltage information received in the dead time period is a threshold or more, the motor failure determination step S840 may determine that the electric motor 30 has a failure.

Figure 9:
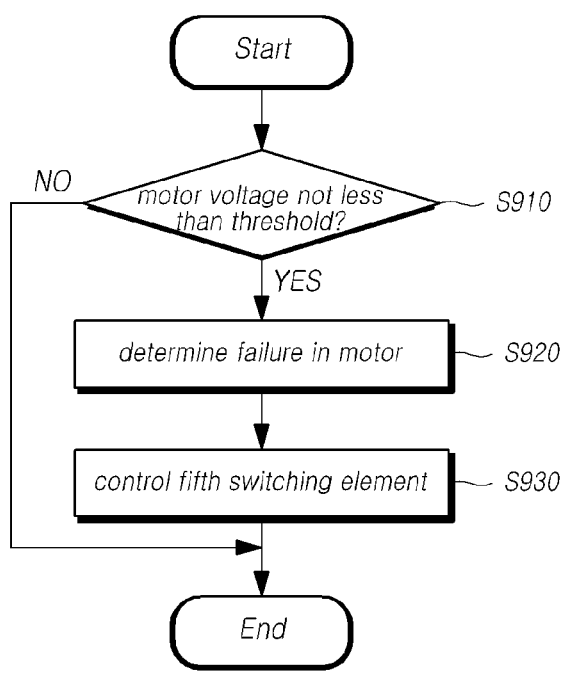
FIG. 9 is a flowchart more specifically illustrating step S840 according to an embodiment.

FIG. 9 is a flowchart more specifically illustrating step S840 according to an embodiment.

Referring to FIG. 9, the motor control device 10 may determine whether the voltage information received in the dead time period is a threshold or more (S910). The voltage information may be the phase voltage of the electric motor 30. The threshold may be a preset voltage value. For example, the threshold may be the voltage value of the battery 40.

When the received voltage information is the threshold or more (Yes in S910), the motor control device 10 may determine that the electric motor 30 has a failure (S920). In this case, the motor control device 10 may determine that the voltage of the electric motor 30 has increased due to a short circuit between the first to fourth switching elements.

If the received voltage information is less than the threshold (No in S910), the motor control device 10 may receive the voltage of the electric motor 30.

As the electric motor 30 is determined to have a failure, the motor control device 10 may control the fifth switching element connected with the battery 40 supplying power to turn off (S930).

As described above, according to the disclosure, the motor control device 10 may detect a short circuit between the motor and the switching element through the voltage of the electric motor, is not affected by a variation in Rdson according to the temperature, and may save costs due to no additional change to the inverter circuit.

The technology of providing a motor control device and method may be implemented as an application or in the form of program instructions executable through various computer components, which may then be recorded in a computer-readable recording medium. The computer-readable medium may include programming commands, data files, or data structures, alone or in combinations thereof.

The programming commands recorded in the computer-readable medium may be specially designed and configured for the present invention or may be known and available to one of ordinary skill in the computer software industry.

Examples of the computer readable recording medium may include, but is not limited to, magnetic media, such as hard disks, floppy disks or magnetic tapes, optical media, such as CD-ROMs or DVDs, magneto-optical media, such as floptical disks, memories, such as ROMs, RAMs, or flash memories, or other hardware devices specially configured to retain and execute programming commands.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A motor control device, comprising:
a controller configured to generate a control signal for controlling an operation of an electric motor;
an inverter controller configured to generate a switching control signal for controlling an operation of one or more switching elements connected to the electric motor, based on the control signal; and
a receiver configured to receive voltage information about a voltage of the electric motor,
wherein the controller is configured to determine whether the electric motor has a failure based on the voltage information received in a dead time period generated according to the control signal,
wherein the electric motor is a single-phase direct-current (DC) motor,
wherein the one or more switching elements include a first switching element and a third switching element connected to a first phase of a 2-phase inverter structure and a second switching element and a fourth switching element connected to a second phase of the 2-phase inverter structure,
wherein a plus terminal of the electric motor is connected to the first phase, and a minus terminal of the electric motor is connected to the second phase, and
wherein the dead time period includes a period from a state in which the first switching element and the fourth switching element are turned on and the second switching element and the third switching element are turned off to a state in which the first switching element and the fourth switching element are turned off and the second switching element and the third switching element are turned on.

2. The motor control device of claim 1, wherein upon determining that the electric motor has the failure, the controller controls a fifth switching element connected with a battery supplying power to turn off.

3. The motor control device of claim 1, wherein the control signal includes power conversion period information according to preset pulse width modulation (PWM).

4. The motor control device of claim 1, wherein the controller is configured to determine that the electric motor has the failure if the voltage information received in the dead time period is a threshold or more.

5. A motor control method, the method performed by a motor control device, the motor control method comprising:
a control signal generation step generating a control signal for controlling an operation of an electric motor of the motor control device;
a switching element control step generating a switching control signal for controlling an operation of one or more switching elements connected to the electric motor, based on the control signal;
a motor voltage reception step receiving voltage information about a voltage of the electric motor; and
a motor failure determination step determining a failure in the electric motor based on the voltage information received in a dead time period generated according to the control signal,
wherein the electric motor is a single-phase direct-current (DC) motor,
wherein the one or more switching elements include a first switching element and a third switching element connected to a first phase of a 2-phase inverter structure and a second switching element and a fourth switching element connected to a second phase of the 2-phase inverter structure,
wherein a plus terminal of the electric motor is connected to the first phase, and a minus terminal of the electric motor is connected to the second phase, and
wherein the dead time period includes a period from a state in which the first switching element and the fourth switching element are turned on and the second switching element and the third switching element are turned off to a state in which the first switching element and the fourth switching element are turned off and the second switching element and the third switching element are turned on.

6. The motor control method of claim 5, further comprising, upon determining that the electric motor has the failure, controlling a fifth switching element of the motor control device which is connected with a battery supplying power to turn off.

7. The motor control method of claim 5, wherein the control signal includes power conversion period information according to preset pulse width modulation (PWM).

8. The motor control method of claim 5, wherein the motor failure determination step determines that the electric motor has the failure if the voltage information received in the dead time period is a threshold or more.

* * * * *